United States Patent
Bass et al.

(10) Patent No.: US 9,527,461 B2
(45) Date of Patent: Dec. 27, 2016

(54) APPARATUS FOR AND METHOD OF PULSED CONTROL OF LOAD ELEMENTS IN MOTOR VEHICLES

(71) Applicant: HKR Seuffer Automotive GmbH & Co. KG, Kupferzell (DE)

(72) Inventors: Wolfgang Bass, Bretzfeld-Adolzfurt (DE); Ralf Abel, Altkrautheim (DE)

(73) Assignee: HKR SEUFFER AUTOMOTIVE GMBH & CO. KG, Kupferzell (DE)

( * ) Notice: Subject to any disclaimer, the term of this patent is extended or adjusted under 35 U.S.C. 154(b) by 416 days.

(21) Appl. No.: 14/174,086

(22) Filed: Feb. 6, 2014

(65) Prior Publication Data
US 2014/0225431 A1    Aug. 14, 2014

(30) Foreign Application Priority Data
Feb. 8, 2013    (DE) ......... 10 2013 002 356

(51) Int. Cl.
*B60L 1/00* (2006.01)
*B60R 16/03* (2006.01)
*F02P 19/02* (2006.01)
*H03K 17/16* (2006.01)

(52) U.S. Cl.
CPC ............ *B60R 16/03* (2013.01); *H03K 17/164* (2013.01); *F02P 19/02* (2013.01); *F02P 19/023* (2013.01)

(58) Field of Classification Search
CPC ........ B60R 16/03; H03K 17/164; F02P 19/02; F02P 19/023

USPC ....................................................... 307/10.1
See application file for complete search history.

(56) References Cited

U.S. PATENT DOCUMENTS 8,626,421 B2 *    1/2014    Fink ..................... F02P 19/026
                                                    701/102

FOREIGN PATENT DOCUMENTS

DE          3713835 A1    11/1988

OTHER PUBLICATIONS

DE 3713835 A1, English translation, obtained from espacenet.com May 20, 2016.*

* cited by examiner

*Primary Examiner* — Hal Kaplan
(74) *Attorney, Agent, or Firm* — Ware, Fressola, Maguire & Barber LLP

(57) ABSTRACT

The present invention concerns a method of and an apparatus for controlling a plurality of load elements in a motor vehicle, wherein corresponding load current pulses for the load elements are so produced that they overlap at least in the region of their rising and falling edges and wherein the configuration in respect of time of the load current pulses is controlled in such a way that a substantially constant overall current is also afforded from the total of the load current pulses of all load elements in the region of the rising and falling edges of the load current pulses.

17 Claims, 3 Drawing Sheets

State of the art

APPARATUS FOR AND METHOD OF PULSED CONTROL OF LOAD ELEMENTS IN MOTOR VEHICLES

CROSS REFERENCE TO RELATED APPLICATION

This application claims priority under 35 USC §119 to German Patent Application No. 10 2013 002 356.4 filed on Feb. 8, 2013, which application is hereby incorporated by reference in its entirety.

TECHNICAL FIELD

The present invention concerns an apparatus for and a method of controlling a plurality of load elements (like for example glow plugs) in a motor vehicle. In that respect the invention can be implemented in the form of a computer program for a programmable control apparatus in the motor vehicle.

BACKGROUND OF THE INVENTION

Due to the increasing number of electronic components on the one hand and due to the networking thereof by way of bus systems in motor vehicles on the other hand, electromagnetic compatibility (EMC) has gained considerably in relevance in the recent years. In principle this means that an electronic component must be insensitive under all specified operating conditions to influences acting thereon from the exterior, it may not influence other electrical systems and during operation thereof it must permit uninterrupted radio reception—both in the automobile itself and also in the environment thereof. The requirements which are to be met in relation to EMC are laid down in the so-called 'Automotive EMC Directive'.

Even products which are not directly confronted with the EMC problems are in the meantime equipped with complex integrated electronic circuits like for example interior heaters, diesel quick-start systems or other switched high-current consumers.

The development of diesel engines has made rapid advances in recent years. Marked improvements have been achieved in terms of emission, consumption, torque production and power density by virtue of new developed components, systems and by virtue of engine management. A glow system (instant start system (ISS)) comprises an electronic glow plug control device and power-optimised glow plugs. Power semiconductors are used in the control device as switches for actuation of the glow plugs, replacing the electromagnetic relay used for that purpose. Each glow plug can be individually actuated in that case.

With electronically controlled glow plugs, temperature behaviour and power consumption are adapted to the glow requirement of the engine by the control device over a wide range. The power consumption is modified by clock control (for example pulse width modulation) of the glow plug current by means of the power semiconductor. In that respect it is possible to achieve a high level of efficiency for the system so that scarcely more than the power required by the glow plug is taken from the on-board circuit system. As with ISS each glow plug is actuated by a separate power semiconductor the current can be separately monitored in each glow plug circuit. That permits individual diagnosis at each plug.

FIG. 2 shows time graphs of pulsed individual load currents and a resulting overall current in a conventionally controlled glow system, wherein pulse-form load currents $i_1$ through $i_3$ are fed to the glow plugs and by virtue of their finite edge steepness result in collapses in the overall current $i_G$ with a period duration $\Delta t$.

Due to the clock control of the high glow plug currents at frequencies of 30 through 100 Hz, detrimental rapid changes in voltage or current thus occur, which can lead to disturbances in respect of EMC.

SUMMARY OF THE INVENTION

The object of the present invention is to provide a method of and an apparatus for controlling a plurality of load elements (like for example glow plugs or the like) with improved EMC.

That object is attained by an apparatus as set forth in claim 1 and a method as set forth in claim 11.

Accordingly load current pulses for the load elements are produced in such a way that the load current pulses of various load elements overlap in the region of their rising and falling edges, wherein the time configuration of the load current pulses is so selected that even in the region of the rising and falling edges of the load current pulses there is a substantially constant overall current from the total of the load current pulses of all load elements.

Optimised sequential switching of the load elements provides that the ac components in the overall supply current fed to the load elements can be reduced as high-frequency components in the edges provide for mutual compensation. That also opens up the possibility of generating individual switch-on and switch-off phases for the load elements at higher frequencies and thus further enhancing the efficiency of the system.

Generation of the load current pulses can also be effected in two or more stages insofar as the controlled switching device of a first load element is controlled directly by the timing control device and the switching device of a further switching element is then actuated by a derived control signal. Thus for example in accordance with a first aspect of the invention a load current can be measured through a first load element and compared to a reference value, wherein the control signal for the switching device of a second load element is then generated in response to the comparison result.

As a second aspect of the present invention there can be provided a regulating device which detects voltages across two different load elements and based on the detected voltage variations and the battery voltage produces a control signal for the switching device of the second load element in such a way that the total of the two voltages or voltage fluctuations is equal to the battery voltage.

In a third aspect of the present invention the timing control device can also have a first control device for controlling the configuration in respect of time of an edge of a first load current pulse for a first load element and a second control device for controlling the configuration in respect of time of an overlapping inverted edge of a second load current pulse for a second load element. That separate control can be a set control without feedback or also a regulated control in dependence on detected voltage fluctuations across the load elements in question.

The apparatus can be implemented by discrete circuit components or at least one integrated circuit or also by a non-transitory memory storing a computer program which controls a microcomputer or microprocessor which then generates the control signals in question for the switching devices in accordance with the above-mentioned method steps.

Advantageous developments of the present invention are recited in the attached appendant claims.

BRIEF DESCRIPTION OF THE DRAWINGS

The invention is described in greater detail hereinafter by means of embodiments by way of example with reference to the drawings in which.

DETAILED DESCRIPTION

Set out hereinafter is a description of embodiments by way of example of the present invention using the example of an electronically controlled glow system for diesel engines.

Figure 1:
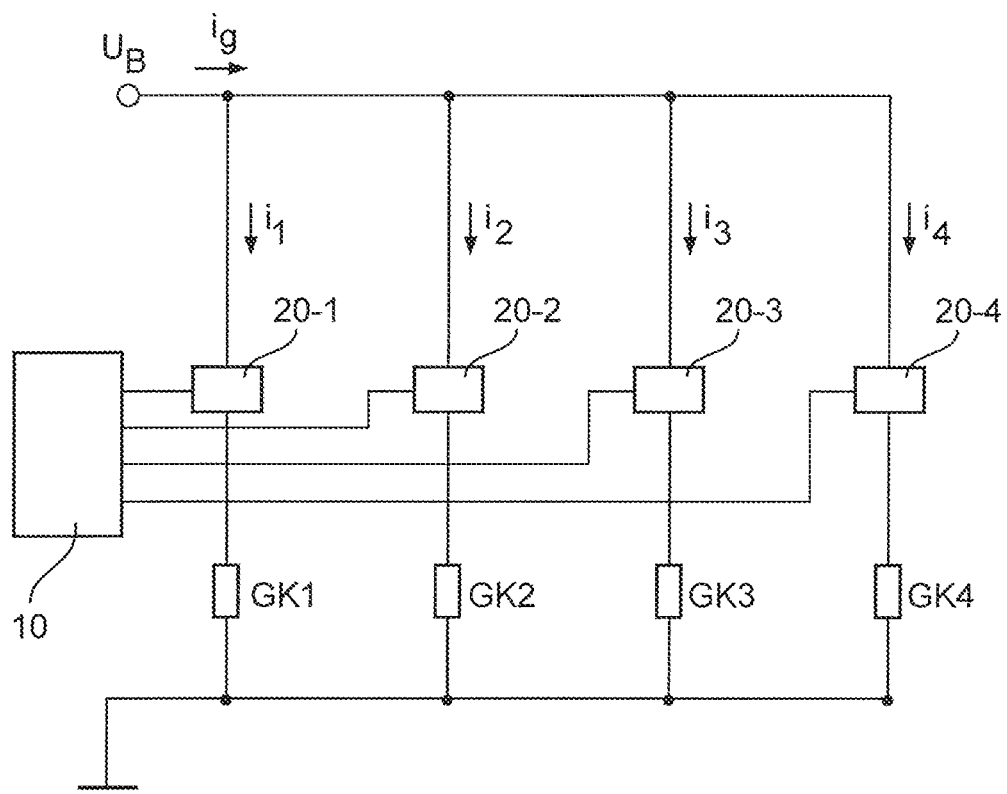
FIG. 1 shows a schematic block circuit diagram of an electronically controlled glow system for diesel engines in a first embodiment.
Figure 2:
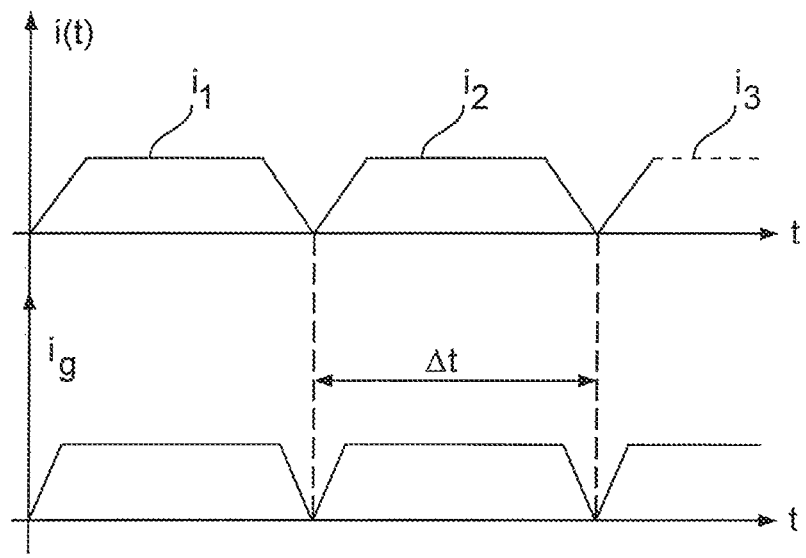
FIG. 2 shows time graphs of pulsed individual load currents and a resulting overall current in a conventional controlled glow system.

FIG. 1 shows a schematic block circuit diagram of the glow system comprising a timing control unit 1 which generates control signals for four different power switches 20-1 through 20-4, wherein the power switches 20-1 through 20-4 are connected into a respective current branch for feeding a respective load current $i_1$ through $i_4$ to corresponding glow plugs GK1 through GK4. Based on the corresponding control signals from the timing control unit 10, pulse-form load currents or load current pulses can be produced for the respective glow plugs. The respective branch currents $i_1$ through $i_4$ are added to give an overall current $i_g$ taken from a battery supply with a battery voltage $U_B$.

In the present first embodiment this involves for example a glow system for a four-cylinder diesel engine which consequently requires four glow plugs GK1 through GK4 as load elements. It will be appreciated that the system can also have a larger or smaller number of glow plugs depending on the type of diesel engine.

The timing control unit 10 can be implemented for example by a microcomputer or microprocessor with corresponding software control stored in a non-transitory memory for generating the required control signals. The power switches 20-1 through 20-4 can be for example metal oxide semiconductor field effect transistors (MOSFETs) as the power semiconductors, for switching the individual glow plugs GK1 through GK4 on and off. In addition there can be provided an electrical interface for communication with an engine management system and an internal voltage supply for the microprocessor and the interface. The timing control unit 10 controls the power switches 20-1 through 20-4, reads the status information thereof and communicates with the engine management by way of the electrical interface. The power switches 20-1 through 20-4 can be so-called high side switches with integrated actuation and protection functions (like for example a charge pump, current limitation and thermal overload shut-down). With the charge pump it is possible to produce the required gate voltage for actuation of the actual switching transistor. Items of status information like open or closed load circuit and activated thermal overload shut-down are available as the output signal.

In the present embodiments the power switches 20-1 through 20-4 are sequentially switched in optimised fashion under the control of the timing control unit 10 so that there is a reduced change in current in the overall current $i_g$, in particular during the switching edges of the branch currents $i_1$ through $i_4$. As a result it is possible to achieve a lower alternating component in the overall current $i_g$ and thus an improved EMC. That can be achieved by the control terminal (for example the gate) of a power switch to be switched off (for example an MOSFET) being briefly discharged until a negative change in the overall current $i_g$ is detected by suitable current measurement or the load voltage of the associated load (for example a glow plug) has reduced. In corresponding fashion the control terminal (for example gate) of a power switch to be switched on (for example an MOSFET) is briefly charged until a positive change in the overall current $i_g$ is detected by suitable current measurement or until the load voltage of the associated load (that is to say a glow plug) increases.

The charging and discharging process can be effected in stepping widths which are optimised in respect of efficiency, that is to say until detection of a first change in the overall current $i_g$, using small stepping widths, and in the analog mode of operation of the power switch after being switched on, using larger stepping widths.

Due to the mutual compensation of the overlapped switching processes, the edge steepness no longer has an effect on the alternating components in the overall current $i_g$ so that the switching-on phase and the switching-off phase respectively can be generated at higher frequencies (that is to say with a steeper rise). For that purpose it is then possible to add an energy buffer (for example an electrolytic capacitor) or a free-wheeling element for generating the required free-wheeling current in the case of inductive loads.

Figure 3:
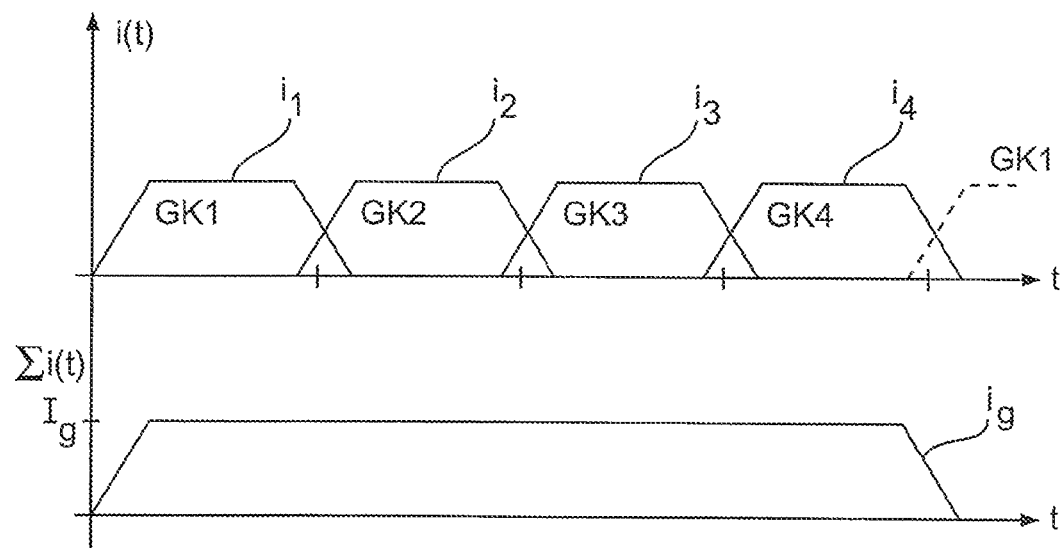
FIG. 3 shows time graphs with overlapped individual load currents and a low-interference overall current resulting therefrom in accordance with the embodiments of the present invention.

FIG. 3 shows time graphs of the individual branch currents $i_1$ through $i_4$ and the overall current $i_g$ of a substantially constant height $I_g$. As can be seen from FIG. 3 the branch currents $i_1$ through $i_4$ obtained by controlled switching by means of the timing control unit 10 are overlapped in respect of time in the edge region so that current summing gives a uniform overall current $i_g$ with markedly reduced ac components by virtue of the absence of current collapses or fluctuations. The position in respect of time of the branch currents in the time graph specifies which of the glow plugs GK1 through GK4 is supplied with a load current at a given moment in time.

In the context of an advantageous development of the first embodiment as shown in FIG. 1 the timing control unit 10 can also have a control or regulating mechanism for altering the edge steepness, for example by storage of a suitable control signal or suitable control signal sequences for the control terminals of the power switches 20-1 through 20-4. In that way the efficiency of the circuit can be increased and it is possible to achieve faster heating of the glow plugs GK1 through GK4 if the steep initial switch-on edge or final switch-off edge can be processed by the system. It will be appreciated that the switching edges need not have a linear configuration. Exponential or quadratic or other non-linear configurations are also possible if an adequate compensation can be achieved by the reversed edge of the overlapping current pulse. The interplay between the overlapping edges of different current pulses can be controlled by the following circuit switching variants.

Figure 4:
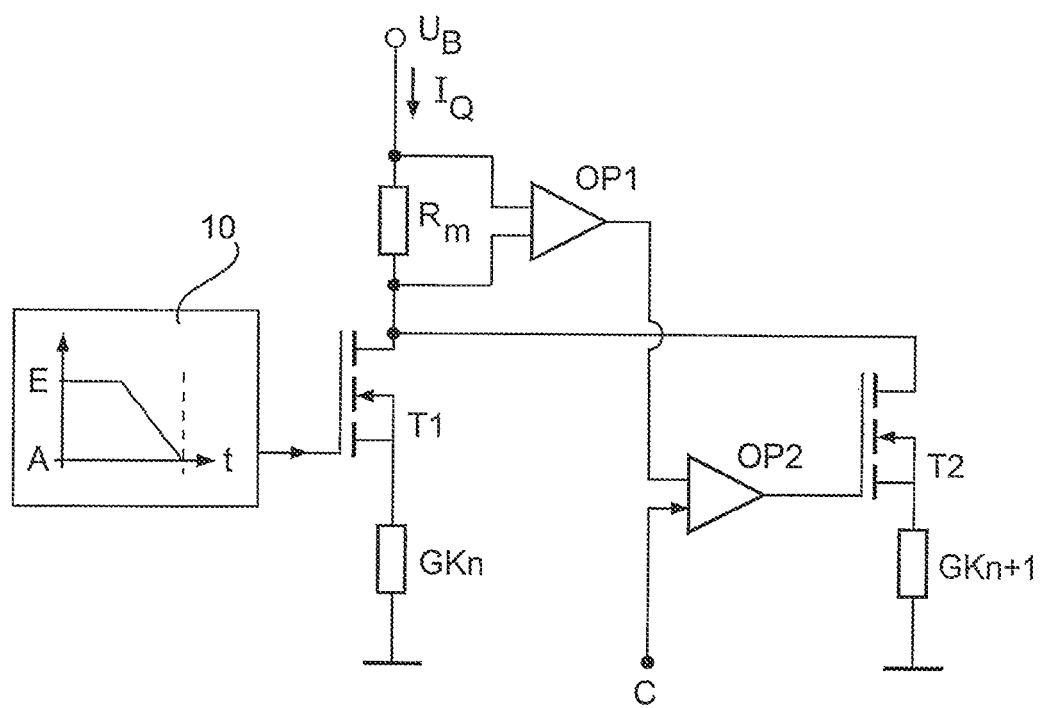
FIG. 4 shows a circuit diagram illustrating the principle of partial control of two glow plugs in accordance with a second embodiment of the present invention.

FIG. 4 shows a circuit diagram in principle of a two-stage edge control system according to a second embodiment of the present invention.

A shunt current $I_Q$ from the supply battery involving a battery voltage $U_B$ is passed by way of a measuring resistor $R_m$ and divided to two power field effect transistors T1 and T2 which produce corresponding current pulses for associated glow plugs $GK_n$ and $GK_{n+1}$ in dependence on control signals at their gate terminals.

The voltage which drops in dependence on the current variation at the measuring resistor $R_m$ is measured by way of a measuring amplifier OP1 and fed to a regulating amplifier OP2 which at its second input terminal has a constant reference value C. Thus a control signal dependent on the measured current variation can be produced at the gate of the second field effect transistor T2, thus giving an overlapping inverse switching edge of the load current pulse at the second glow plug $GK_{n+1}$.

Current regulation is thus effected by way of indirect current detection by measurement of the voltage drop at the measuring resistor $R_m$. The form of the first edge at the first field effect transistor T1 can be predetermined by the timing control unit 10 by way of a suitable control presetting with a configuration which is predetermined in respect of time. The functions of the measuring amplifier OP1 and the regulating amplifier OP2 can alternatively also be implemented by at least one microcomputer with corresponding programming.

A similar two-stage control circuit can be provided for each further pair of glow plugs.

Figure 5:
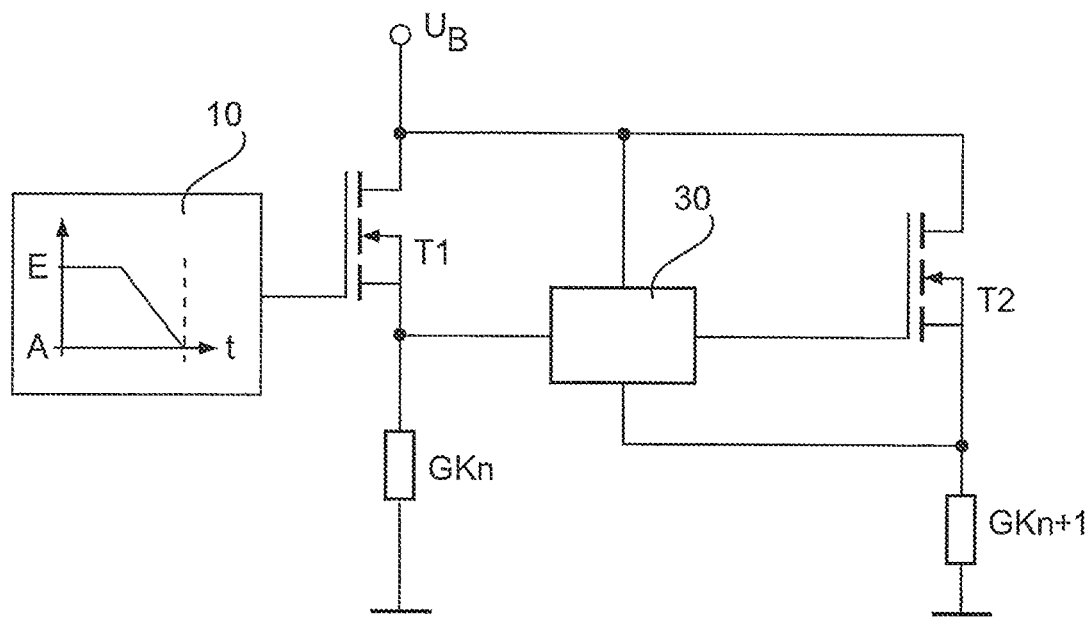
FIG. 5 shows a circuit diagram illustrating the principle of partial control of two glow plugs in accordance with a third embodiment of the present invention.

FIG. 5 shows a circuit diagram illustrating the principle of a further circuit variant for a two-stage actuating circuit according to a third embodiment for achieving the mutually overlapping and compensating switching edges. A regulating element 30 which can be a microprocessor and/or a part of the timing control unit 10 then detects the voltage across a first glow plug $GK_n$ at the source terminal of a first field effect transistor T1 and the voltage across a second glow plug $GK_{n+1}$ at the source terminal of a second field effect transistor T2. In addition the regulating element 30 also detects the battery voltage $U_B$ and produces a control signal for the gate terminal of the second field effect transistor T2 in such a fashion that the sum of the detected voltages across the first glow plug $GK_n$ and the second glow plug $GK_{n+1}$ constantly corresponds to the battery voltage. This therefore affords mutually compensating edge configurations of the two voltage configurations across the glow plugs and thus also corresponding current configurations. A control signal with a predetermined edge is fed as a reference edge to the gate terminal of the first field effect transistor T1 by means of the timing control unit 10. The regulating element 30 can have various regulating properties with a proportional, differential and/or integrating characteristic.

It will be appreciated that in this case too it is possible to provide further switching stages for each further pair of glow plugs.

Figure 6:
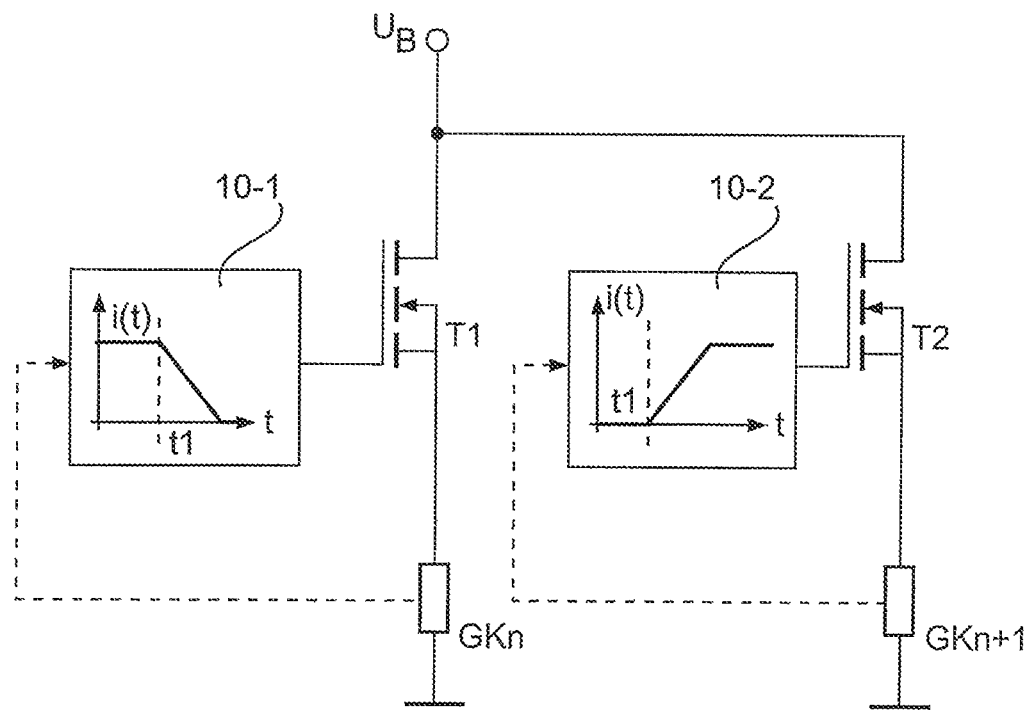
FIG. 6 shows a circuit diagram illustrating the principle of partial control of two glow plugs in accordance with a fourth embodiment of the present invention.

FIG. 6 shows a circuit diagram illustrating the principle of a further circuit variant for two-stage edge control in accordance with a fourth embodiment. In this circuit variant predetermined actuating signals are fed at the gate to both field effect transistors T1 and T2, wherein the signals can be obtained from two different timing control units or timing control unit components 10-1 and 10-2 or from different outputs of the single timing control unit 10. The predetermined time configurations can be read out of a memory, generated by a stored function or produced by discrete components in the timing control unit 10. The time characteristic in the case of the control signals is so selected that the superimpositioning of the two edges gives a constant overall current from the supply battery. This therefore involves a set actuation of the two field effect transistors T1 and T2. The feedback paths shown in broken line can be implemented as an additional modification with a regulated output voltage based on a return of the voltage at the respective glow plugs $GK_n$ and $GK_{n+1}$. That can be achieved by suitable current measuring devices as for example in FIG. 4.

In the above-mentioned embodiments, actuation of the power switches (for example MOSFETs) can be actuated in analog fashion (for example by way of a corresponding amplifier), by means of clock-controlled current (for example by way of an integrated circuit) or by way of a clock-controlled voltage (for example by means of a microcontroller), wherein in the case of actuation by means of clock-controlled voltage an RC combination can be provided at the gate terminal of the field effect transistor. In that case the capacitance C can also be the internal gate-source capacitance $C_{GS}$ of the field effect transistor.

In the above-mentioned embodiments the transition from the switched-on condition to the switched-off condition or from the switched-off condition to the switched-on condition in the case of the power switches can also be effected stepwise so that, with the mutual overlapping of the transition regions, there is also a certain compensation effect with a low level of ripple in the overall current. In addition in the above-mentioned embodiments edge control can also be effected in dependence on the engine operation, for example in dependence on the crankshaft angle of the diesel engine.

It will be appreciated that the MOSFETs T1 and T2 used as an example for the power switches can also be replaced by other controlled power semiconductors.

Based on the object of improving the EMC properties of pulsed load currents, it is evident that the present invention is not limited to electronically controlled glow systems for diesel engines but can be used in connection with the most widely varying control systems for a plurality of load elements in a motor vehicle.

What is claimed is:

1. An apparatus for controlling a plurality of load elements in a motor vehicle, wherein the apparatus includes:
   a plurality of controlled switching devices, each controlled switching device producing an individual load current pulse for a corresponding load element, and
   a timing control device for producing and feeding corresponding control signals to respective control terminals of the switching devices so that the individual load current pulses overlap in a region of their rising and falling edges,
   wherein the timing control device is adapted so as to form a configuration of control signals based at least in part on time such that a substantially constant overall current is also afforded from the total of the load current pulses of all load elements in the region of the rising and falling edges of the load current pulses, and
   wherein the apparatus further includes measuring means for measuring a load current pulse controlled by the timing control device through a first load element and comparison means for comparing the measurement result of the measuring means to a reference value and producing a control signal for the switching device of a second load element in response to the comparison result.

2. The apparatus as set forth in claim 1, wherein the measuring means and the comparison means each respectively include an operational amplifier.

3. The apparatus as set forth in claim 2, wherein the load elements have glow plugs of a diesel engine.

4. The apparatus as set forth in claim 2, wherein the timing control device is adapted to form a configuration in respect of time of the control signals such that there is a linear rise or fall in the load current pulses in the edge region.

5. The apparatus as set forth in claim 1, wherein the load elements have glow plugs of a diesel engine.

6. The apparatus as set forth in claim 1, wherein the timing control device is adapted to form a configuration in respect of time of the control signals such that there is a linear rise or fall in the load current pulses in the edge region.

7. An apparatus for controlling a plurality of load elements in a motor vehicle, wherein the apparatus includes:
   a plurality of controlled switching devices, each controlled switching device producing an individual load current pulse for a corresponding load element, and
   a timing control device for producing and feeding corresponding control signals to respective control terminals of the switching devices so that the individual load current pulses overlap in a region of their rising and falling edges,
   wherein the timing control device is adapted so as to form a configuration of control signals based at least in part on time such that a substantially constant overall current is also afforded from the total of the load current pulses of all load elements in the region of the rising and falling edges of the load current pulses, and
   wherein the apparatus further includes a regulating device for detecting the voltages across a first load element whose load current pulse is controlled by the timing control unit and across a second load element and the battery voltage and for producing and feeding a control signal to a switching device of the second load element so that the sum of the voltages across the first and second load elements is equal to the battery voltage.

8. The apparatus as set forth in claim 7, wherein the load elements have glow plugs of a diesel engine.

9. The apparatus as set forth in claim 7, wherein the timing control device is adapted to form a configuration in respect of time of the control signals such that there is a linear rise or fall in the load current pulses in the edge region.

10. An apparatus for controlling a plurality of load elements in a motor vehicle, wherein the apparatus includes:
    a plurality of controlled switching devices, each controlled switching device producing an individual load current pulse for a corresponding load element, and
    a timing control device for producing and feeding corresponding control signals to respective control terminals of the switching devices so that the individual load current pulses overlap in a region of their rising and falling edges,
    wherein the timing control device is adapted so as to form a configuration of control signals based at least in part on time such that a substantially constant overall current is also afforded from the total of the load current pulses of all load elements in the region of the rising and falling edges of the load current pulses, and wherein the timing control device has a first control device for controlling the configuration in respect of time of an edge of a first load current pulse for a first load element and a second control device for controlling the configuration in respect of time of an overlapping reversed edge of a second load current pulse for a second load element.

11. The apparatus as set forth in claim 10, wherein a control of the first and second control devices is implemented in dependence on detected voltage configurations across the first and second load element respectively.

12. The apparatus as set forth in claim 11, wherein the load elements have glow plugs of a diesel engine.

13. The apparatus as set forth in claim 11, wherein the timing control device is adapted to form a configuration in respect of time of the control signals such that there is a linear rise or fall in the load current pulses in the edge region.

14. The apparatus as set forth in claim 10, wherein the load elements have glow plugs of a diesel engine.

15. The apparatus as set forth in claim 10, wherein the timing control device is adapted to form a configuration in respect of time of the control signals such that there is a linear rise or fall in the load current pulses in the edge region.

16. An apparatus for controlling a plurality of load elements in a motor vehicle, wherein the apparatus includes:
    a plurality of controlled switching devices, each controlled switching device producing an individual load current pulse for a corresponding load element, and
    a timing control device for producing and feeding corresponding control signals to respective control terminals of the switching devices so that the individual load current pulses overlap in a region of their rising and falling edges,
    wherein the timing control device is adapted so as to form a configuration of control signals based at least in part on time such that a substantially constant overall current is also afforded from the total of the load current pulses of all load elements in the region of the rising and falling edges of the load current pulses,
    wherein the controlled switching devices have field effect transistors, and
    wherein the timing control device is adapted to discharge the gate electrode of a field effect transistor to be switched off until a negative change in the overall current is detected or the voltage across the associated load element is reduced and to charge up the gate electrode of a field effect transistor to be switched on until a positive change in the overall current is detected or the voltage across the associated load element has increased.

17. A computer program comprising a non-transitory memory stored with code for control of a plurality of load elements in a motor vehicle comprising the steps of:
    producing load current pulses for the load elements, wherein the load current pulses overlap in a region of their rising and falling edges, and
    controlling a configuration in respect of time of the load current pulses in such a way that a substantially constant overall current is also afforded from the total of the load current pulses of all load elements in the region of the rising and falling edges of the load current pulses, said steps produced upon execution of the computer program in a computer apparatus.

* * * * *